United States Patent [19]
Ishizuka et al.

[11] Patent Number: 5,476,182
[45] Date of Patent: Dec. 19, 1995

[54] ETCHING APPARATUS AND METHOD THEREFOR

[75] Inventors: Shuichi Ishizuka, Nirasaki; Kohei Kawamura; Jiro Hata, both of Yamanashi, all of Japan

[73] Assignee: Tokyo Electron Limited, Tokyo, Japan

[21] Appl. No.: 117,683

[22] Filed: Sep. 8, 1993

[30] Foreign Application Priority Data

Sep. 8, 1992 [JP] Japan ................................. 4-265380

[51] Int. Cl.$^6$ ........................................ H05H 1/00
[52] U.S. Cl. ........................ 216/68; 216/74; 156/345; 156/643.1; 156/646.1
[58] Field of Search .................... 216/68, 74; 156/643.1, 156/345; 204/192.35, 192.32, 298.34, 298.37; 118/723 MR, 723 E, 723 ER, 723 I, 723 IR

[56] References Cited

U.S. PATENT DOCUMENTS 5,138,973  8/1992  Davis et al. ........................ 156/643 X Primary Examiner—Thi Dang
Attorney, Agent, or Firm—Oblon, Spivak, McClelland, Maier & Neustadt

[57] ABSTRACT

An etching apparatus for etching an insulating film of an object to be processed having the insulating film comprises a first chamber into which an inert gas is introduced, a plasma generating section for converting the inert gas to a plasma in the first chamber, a second chamber, which communicates with the first chamber, for receiving a reactive gas for etching the insulating film and generating radicals of the reactive gas therein, and a support electrode for supporting the object to be processed in the second chamber and attracting ions in the plasma of the inert gas to the object to be processed. The radicals is generated when the reactive gas introduced into the second chamber is excited by the plasma of the inert gas diffused from the first chamber to the second chamber. The insulating film and the radicals react with each other by the assist of the ions of the inert gas, thereby etching the insulating film.

32 Claims, 3 Drawing Sheets

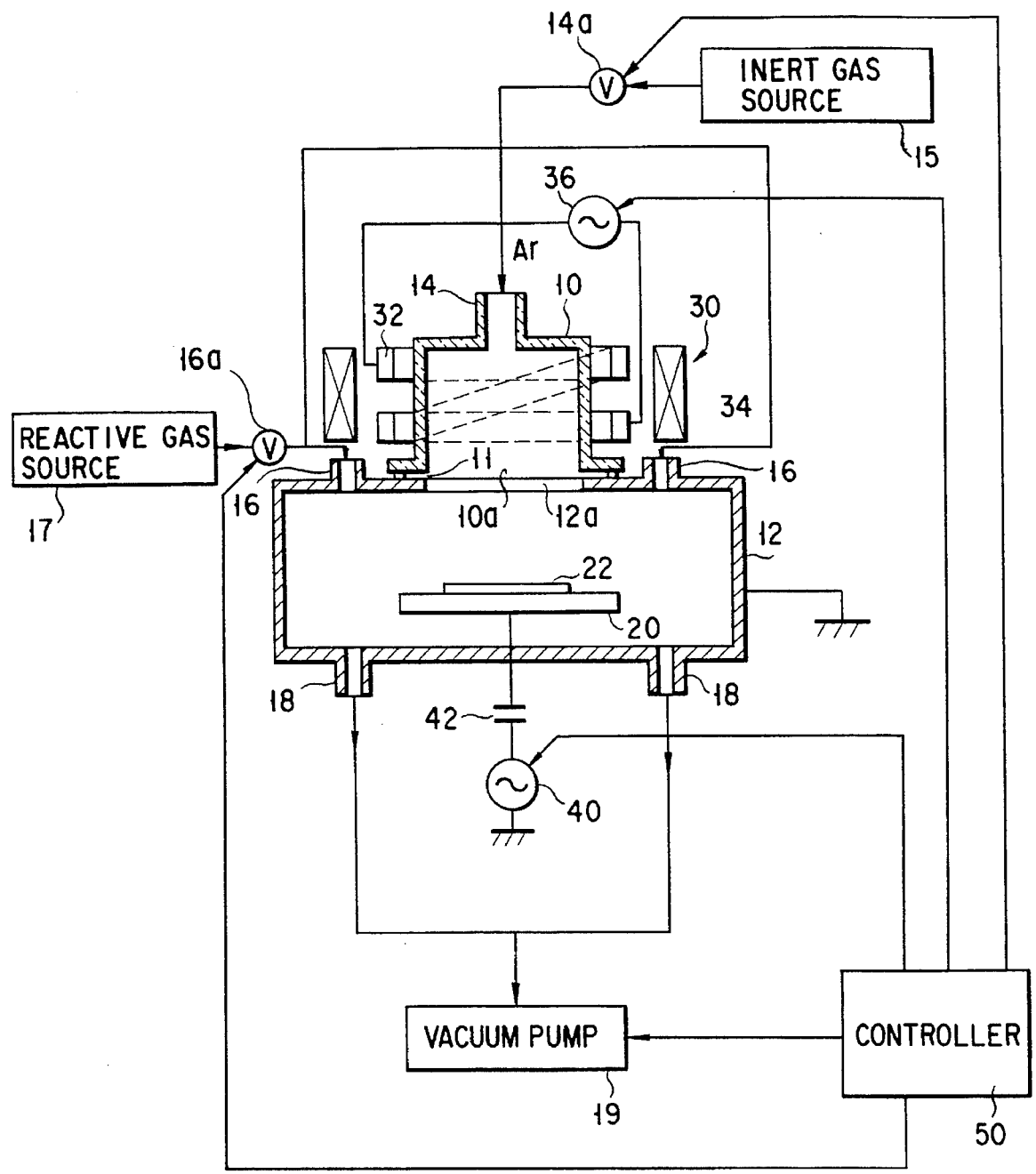
F I G. 1

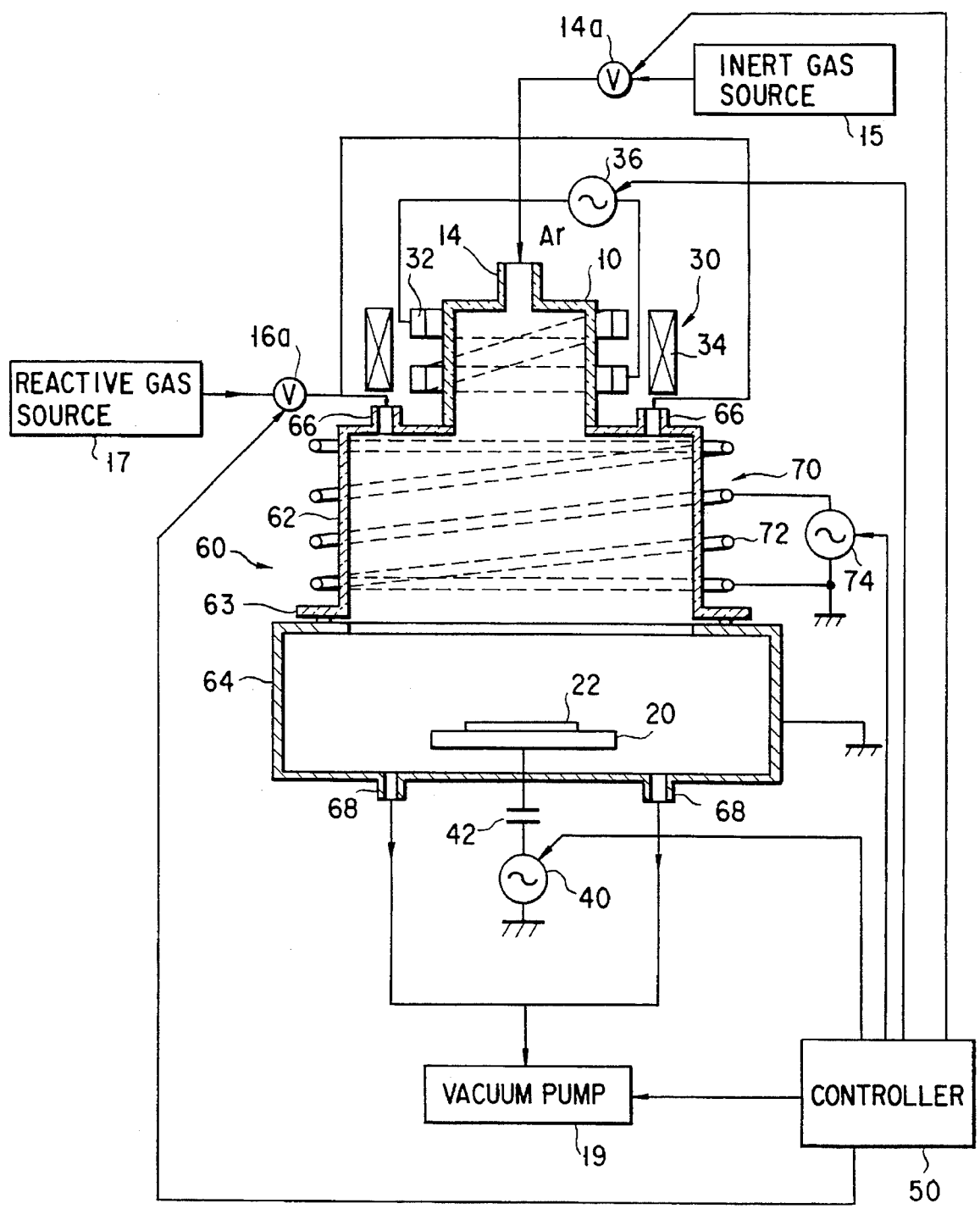
F I G. 5

ETCHING APPARATUS AND METHOD THEREFOR

BACKGROUND OF THE INVENTION

1. Field of the Invention

The present invention relates to an etching apparatus and a method therefor, capable of performing low-pressure process etching.

2. Description of the Related Art

The most popular conventional dry etching apparatuses have parallel-plate electrodes, and RIE (Reactive Ion Etching) apparatuses and (Plasma Etching) apparatuses are known as such apparatuses. In either scheme, in order to generate a plasma with an etching gas and to maintain the plasma, the gas pressure in the etching chamber must be set to a comparatively high pressure of 100 mTorr or more. In etching in a comparatively high pressure atmosphere like this, a reaction by-product forms dust. Especially in a recent semiconductor device requiring micropatterning, the dust decreases the processing yield.

In an RIE dry etching apparatus, physical etching is mainly performed. Thus, high-energy ions of, e.g., 500 to 600 eV are incident on the wafer, leading to the damage to the semiconductor wafer.

In a PE dry etching apparatus, it is pointed out that although an etching shape dan be controlled comparatively easily, it is difficult to obtain a high etching rate.

In either scheme, the problem related to wafer damage caused by the ion energy of the reactive etching gas is conspicuous when the etching target is an oxide film, and the problem on destruction, of a gate oxide film and the like are particularly pointed out.

Recently, a magnetron RIE scheme is put into practice in which etching for micropatterning is performed by generating a high-density plasma in a comparatively low-pressure atmosphere. According to this scheme, however, electrons are locally present at wafer end portions in a direction perpendicular to the electric field and magnetic field, thereby causing a non-uniform plasma. Although rotation of the magnetic field and scanning are performed, a plasma is locally present on the wafer during a certain short period of time. This causes destruction of a gate oxide film constituting, e.g., a memory element. The problem on the destruction of the oxide film has not yet been effectively solved.

SUMMARY OF THE INVENTION

It is, therefore, an object of the present invention to provide an etching apparatus and a method therefor, capable of decreasing, when an insulating film, e.g., an oxide film, in an object to be processed is etched, destruction of the insulating film, and performing highly anisotropic etching.

According to the first aspect of the present invention, there is provided an apparatus for etching an insulating film of an object to be processed having the insulaitng film, comprising: a first chamber into which an inert gas is introduced; means for converting the inert gas to a plasma in the first chamber; a second chamber, which communicates with the first chamber, for receiving a reactive gas for etching the insulating film and generating radicals of the reactive gas therein; supporting means for supporting the object to be processed in the second chamber; and attracting means for attracting ions in the plasma of the inert gas to the object to be processed, wherein the radicals are generated when the reactive gas introduced into the second chamber is excited by the plasma of the inert gas diffused from the first chamber to the second chamber, and the insulating film and the radicals react with each other by the assist of the ions of the inert gas, thereby etching the insulating film.

According to the second aspect of the present invention, there is provided an apparatus for etching an insulating film of an object to be processed having the insulating film, comprising: means for converting an inert gas to a plasma in a plasma generating region separate from the object to be processed; means for generating radicals by exciting a reactive gas by the plasma of the inert gas in a region separate from the plasma generating region; and means for attracting ions in the plasma of the inert gas to the object to be processed and causing a reaction between the insulating film and the radicals by the assist of the ions.

According to the third aspect of the present invention, there is provided a method of etching an insulating film of an object to be processed having the insulating film, comprising the steps of: converting an inert gas to a plasma in a plasma generating region separate from the object to be processed; generating radicals by exciting a reactive gas by the plasma of the inert gas in a region separate from the plasma generating region, and attracting ions in the plasma of the inert gas to the object to be processed and causing a reaction between the insulating film and the radicals by the assist of the ions.

According to the present invention, the reactive gas is excited by the plasma of the inert gas to generate the radicals, and the insulating film and the radicals are caused to react with each other by the assist of the ions in the plasma of the inert gas, thereby promoting etching. Therefore, it suffices if the ions have an energy capable of promoting the reaction, and the ion energy can thus be low. Accordingly, damage to the insulating film of the object to be processed can sufficiently be decreased. Furthermore, since the reactive gas is excited by the plasma of the inert gas, etching can be performed in an atmosphere in which the pressure of the reactive gas itself is comparatively low. Therefore, ion scattering is decreased, and the ions can thus be easily incident vertically on the object to be processed, so that the anisotropy of etching can be improved.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a sectional view showing the schematic structure of an etching apparatus according to the first embodiment of the present invention;

FIG. 5 is a sectional view showing the schematic structure of an etching apparatus according to the second embodiment of the present invention.

DETAILED DESCRIPTION OF THE PREFERRED EMBODIMENTS

Figure 2:
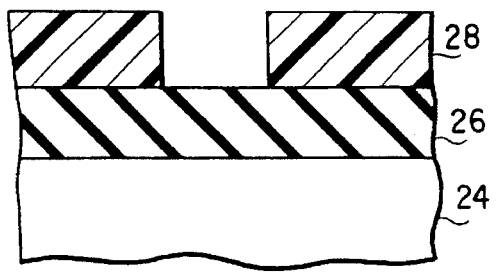
FIG. 2 is a sectional view showing a semiconductor wafer having an oxide film as the etching target.

The present invention will be described in detail with reference to the accompanying drawings.

FIG. 1 is a sectional view showing the schematic structure of an etching apparatus according to the first embodiment of the present invention. This etching apparatus is used for etching an insulating film of an object to be processed, e.g., a semiconductor film, and has a first chamber 10 and a second chamber 12 provided under the first chamber 10 and having a larger diameter than that of the first chamber 10. An opening 10a is formed in the lower portion of the first chamber 10. An opening 12a is formed in the upper portion of the second chamber 12. The first and second chambers 10 and 12 communicate with each other through these openings 10a and 12a. An O-ring 11 is interposed between the chambers 10 and 12, thereby hermetically connecting them.

The first chamber 10 is made of an insulating material, e.g., silica glass, alumina, or silicon nitride, and the second chamber 12 is made of a conductive material, e.g., Al. A gas inlet pipe 14 for introducing an inert gas is connected to the upper end of the first chamber 10. The gas inlet pipe 14 is connected to an inert gas source 15 so that an inert gas, e.g., Ar, Kr, or Xe, of the inert gas source 15 is introduced into the first chamber 10 through the gas inlet pipe 14. A valve 14a for opening/closing the gas inlet pipe 14 is provided midway along the gas inlet pipe 14.

A support table 20 for supporting the object to be processed is provided in the second chamber 12 at a position opposing the first chamber 10. An object 22 is placed on the support table 20. The object 22 is preferably fixed on the support table 20 with an appropriate fixing means, e.g., a vacuum chuck, an electrostatic chuck, or a clamp ring.

The object 22 to be processed has an insulating film as the etching target. The insulating film is, e.g., an oxide film or a nitride film, and more specifically, can be $SiO_2$, $Ta_2O_5$, $Si_3N_4$, or glass (e.g. BPSG). A semiconductor wafer having a structure shown in FIG. 2 can be used as the object 22 to be processed. The semiconductor wafer shown in FIG. 2 has a silicon substrate 24, an oxide film ($SiO_2$) 26 formed on the silicon substrate 24 and serving as the etching target, and a resist 28 formed on the oxide film 26 and having an etching pattern formed thereon.

A plurality (two in FIG. 1) of reactive gas inlet pipes 16 are connected to the peripheral portion of the coupling portion of the second chamber 12 coupled to the first chamber 10 in the circumferential direction. The gas inlet pipes 16 are merged into a single pipe and connected to a reactive gas source 17. A reactive gas in the reactive gas source 17 is introduced into the second chamber 12 through the gas inlet pipes 16. A valve 16a for opening/closing the gas inlet pipes 16 is provided at the merge portion of the gas inlet pipes 16.

The reactive gas is used for reacting with the insulating film to etch it and usually uses a gas containing a halogen element. Fluorine (F) is preferable as the halogen element. When the etching target is $SiO_2$, a gas of, e.g., $CHF_3$ or $CF_4$, or a gas mixture of $CF_4$ and $H_2$ is used.

Exhaust pipes 18 for evacuating the interiors of the first and second chambers 10 and 12 are connected to the bottom wall of the second chamber 12. A vacuum pump 19 is connected to the exhaust pipes 18. The interiors of the first and second chambers 10 and 12 are evacuated by the vacuum pump 19 and maintained at a predetermined vacuum degree.

A helicon wave type plasma generating section 30 is provided to the first chamber 10. The helicon wave type plasma generating section 30 has a loop antenna 32, a magnetic field generator 34, and a first RF power supply 36. The loop antenna 32 is wound on the circumferential portion of the insulating first chamber 10 in two turns in, e.g., the direction of the diameter of the first chamber 10. The magnetic field generator 34 is arranged around the loop antenna 32 to generate a magnetic field in the first chamber 10. The first RF power supply 36 is connected to the two ends of the loop antenna 32. As the first RF power supply 36, for example, one having a commercial frequency of 13.56 MHz is used.

The conductive second chamber 12 is grounded. A second RF power supply 40 is connected, through a capacitor 42, to the support table 20 arranged in the second chamber 12. As the second RF power supply 40, one having a commercial frequency of 13.56 MHz can similarly be used. However, it is preferable to use an RF power supply having a lower frequency than that, e.g., several hundreds kHz, as will be described later. The RF power supplied to between the second chamber 12 and the support table 20 can have a comparatively low power and is set to, e.g., 300 W or less.

The RF power supplies 36 and 40, the valves 14a and 16a, and the vacuum pump 19 are connected to a controller 50. The vacuuming timing, the gas supply timings, and the timings of applying the RF power are controlled by the controller 50.

An etching operation performed by the etching apparatus having the arrangement as described above will be described by way of a case wherein Ar is used as an inert gas, $CHF_3$ is used as a reactive gas, and a semiconductor wafer having the structure as shown in FIG. 2 is used as the object to be processed.

The interiors of the first and second chambers 10 and 12 are evacuated by the vacuum pump 19 through the exhaust pipes 18 to set the interiors of these chambers 10 and 12 to a high vacuum degree of, e.g., $10^{-6}$ Torr.

Figure 3:
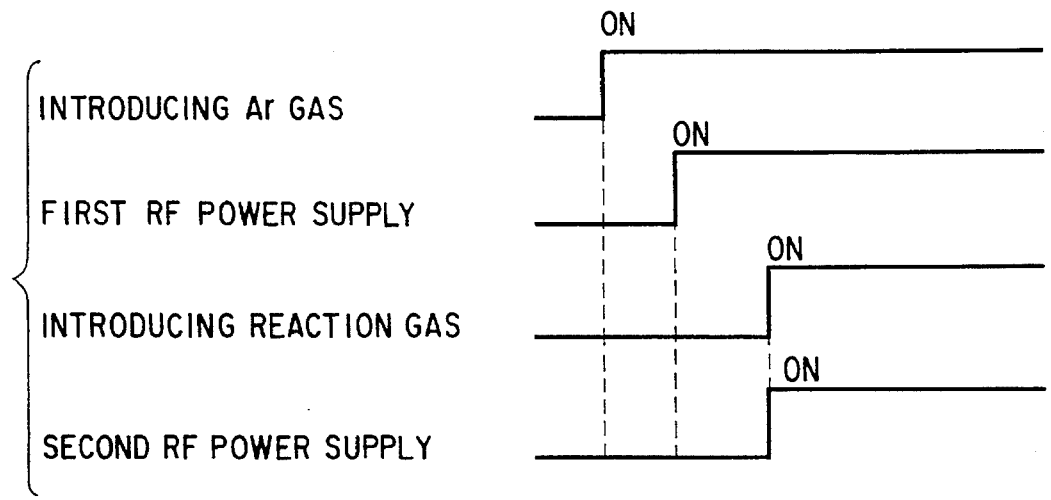
FIG. 3 is a timing chart showing gas introduction timings and the ON timings of power supplies when etching is performed using the apparatus of FIG. 1.

The valve 14a is opened to introduce the Ar gas from the inert gas source 15 into the first chamber 10 through the gas inlet pipe 14, and subsequently the first RF power supply 36 is turned on. Thereafter, the CHF3 gas as the reactive gas is introduced from the reactive gas source 17 into the second chamber 12 through the gas inlet pipes 16, and simultaneously the second RF power supply 40 is turned on. The gas introduction timings and the power supply turn-ON timings of this case are shown in FIG. 3.

As a result, in the first chamber 10, the Ar gas is converted to a plasma by the function of the helicon wave type plasma generating section 30. A helicon wave propagating in a magnetic field at a low frequency can accelerate only electrons during propagation in accordance with the Landau damping effect, thereby increasing the density of the plasma. Since the Ar gas is excited comparatively easily, the plasma is generated while the interior of the first chamber 10 is maintained at a comparatively low pressure.

The Ar plasma generated in the first chamber 10 is diffused to the second chamber 12, and, e.g., electrons in the Ar plasma excite the reactive gas. That is, the electrons in the plasma of the Ar gas assists exciting the reactive gas. Therefore, even if the pressure in the second chamber 12 is comparatively low, a larger amount of radicals is generated compared to the conventional apparatus that generates the plasma of a reactive gas by the operation of the electric field between the parallel-plate electrodes. For example, even when the pressure in the second chamber 12 is several to several tens mTorr, a large amount of radicals can be generated. The radicals are adsorbed by the semiconductor wafer 22 on the support table 20.

The pressure in the second chamber 12 is preferably 100 mTorr or less from the viewpoint of preventing gas scattering and thus maintaining the anisotropy of etching, and is more preferably 10 mTorr or less.

The pressure in the first chamber 10 is preferably higher than that in the second chamber 12. When the pressures are set in this manner, the reactive gas or the radicals thereof in the second chamber 12 is prevented from being introduced into the first chamber 10, so that the electrons in the plasma generated in the first chamber 10 smoothly move into the second chamber 12. This pressure difference can be easily formed by, e.g., arranging a mesh member between the first and second chambers 10 and 12. It suffices if the pressure in the first chamber 10 is set to such a degree that enables generation of a plasma. This pressure is preferably 100 mTorr or more in relation to the pressure in the second chamber 12, and is more preferably 1 Torr or more.

Figure 4:
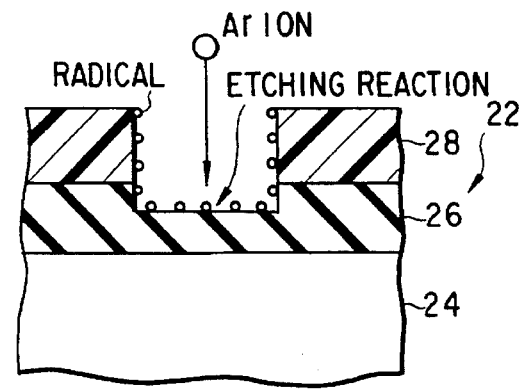
FIG. 4 is a view for explaining the etching principle of the present invention.

An RF power is supplied to between the wall portion of the second chamber 12 and the support table 20 arranged in it, and electrons in the second chamber 12 can move easily while ions in it cannot move easily. Therefore, the support table 20 side is constantly at the negative potential so that a DC bias is applied to it, i.e., a self-bias effect is obtained. Accordingly, the Ar ions generated in the first chamber 10 are accelerated toward the support table 20 along the direction of the electric field thereof. Then, the Ar ions are incident vertically on the semiconductor wafer 22, as shown in FIG. 4, the radicals adsorbed by the semiconductor wafer 22 is thus activated, and a chemical reaction occurs between the activated radicals and the oxide film 26, thereby promoting etching of the oxide film 26.

Since the interior of the second chamber 12 is set to a comparatively low pressure, as described above, scattering of the Ar ions generated by collision of the accelerated Ar ions against the gas is decreased and the number of scattered molecules is decreased. Therefore, the anisotropy of etching is improved.

In addition, according to this etching scheme, chemical etching caused by the radicals is promoted by supplying the physical energy of the ions. Hence, it suffices if the ions have an energy capable of promoting the reaction, and etching can be promoted even if the ions have a low energy of about 100 ev. Therefore, the supply power of the second RF power supply 40 can be as low as, e.g., 300 W. Since the ion energy can be set low in this manner, when the oxide film 26 is etched, its destruction can be sufficiently decreased. This effect is conspicuous especially in a gate oxide film that conventionally poses a problem of destruction.

The $CHF_3$ or $CF_4+H_2$ reactive gas described above is established as the etching gas for $SiO_2$, has a high selection ratio to silicon, and can maintain a high etching rate of $SiO_2$. In the above apparatus, low-pressure etching can be realized by employing gas etching like this. Therefore, anisotropic etching can be achieved without damaging the oxide film, which is suitable for recent micropattern etching.

As described above, it is preferable to set the second RF power supply 40 to have a frequency lower than 13.56 MHz which is a commercial frequency, e.g., several hundreds kHz. When a low frequency is set in this manner, ions can move to follow the positive-negative inversion of the RF voltage. Then, the etching rate can be increased by utilizing not only the motion of the electrons but also the motion of the ions in the plasma.

The second embodiment of the present invention will be described. FIG. 5 is a sectional view showing the schematic structure of an etching apparatus according to the second embodiment of the present invention. The etching apparatus of the second embodiment is different from that of the first embodiment in that a means for auxiliarily exciting the reactive gas is provided. Excluding that the means for auxiliarily exciting the reactive gas is provided and that the structure of the second chamber is different accordingly, this apparatus of the second embodiment basically has the same structure as that of the first embodiment. Therefore, the same portions are denoted by the same reference numerals, and a detailed description thereof will be omitted.

In this apparatus, a second chamber 60 has an upper chamber 62 and a lower chamber 64. The upper chamber 62 has a larger diameter than that of a first chamber 10, and the lower chamber 64 has a larger diameter than that of the upper chamber 62. The first chamber 10 and the upper chamber 62 communicate with each other through an opening 10a of the first chamber 10 and an upper opening 62a of the upper chamber 62, and the upper chamber 62 and the lower chamber 64 communicate with each other through a lower opening 62b of the upper chamber 62 and an upper opening 64a of the lower chamber 64.

The upper chamber 62 is made of an insulating material, e.g., silica glass, alumina, or silicon nitride, in the same manner as the first chamber 10, and is preferably formed integrally with the first chamber 10. The lower chamber 64 is made of a conductive material, e.g., Al. An O-ring 63 is interposed between the upper and lower chambers 62 and 64, thereby hermetically connecting them.

A plurality (two in FIG. 5) of reactive gas inlet pipes 66 are connected to the peripheral portion of the coupling portion of the upper chamber 62 coupled to the first chamber 10 in the circumferential direction. The gas inlet pipes 66 are merged into a single pipe and connected to a reactive gas source 17. A reactive gas in the reactive gas source 17 is introduced into the upper chamber 62 through the reactive gas inlet pipes 66.

An auxiliary exciting means, e.g., a helical resonance type plasma generating section 70 is arranged outside the upper chamber 62 to assist excitation of the reaction gas in it. The helical resonance type plasma generating section 70 has a coil 72 helically wound on the circumferential portion of the insulating upper chamber 62, and a third RF power supply 74, connected to a point of the coil 72 matched to have an optimal power transmission line impedance, for introducing an RF power with a high Q value. The length of the coil 72 is set to ¼ or ½ that of the free space wavelength.

A support table 20 is provided in the lower chamber 64 to support an object to the processed at a position opposing the first chamber 10, in the same manner as in the second chamber 12 of the first embodiment. An object 22 to be processed is placed on the support table 20, in the same manner as in the first embodiment.

Exhaust pipes 68 for evacuating the interiors of the first and second chambers 10 and 60 are connected to the bottom wall of the lower chamber 64. A vacuum pump 19 is connected to the exhaust pipes 68, in the same manner as in the first embodiment. The interiors of the first and second chambers 10 and 60 are evacuated by the vacuum pump 19 and maintained at a predetermined vacuum degree. In the second embodiment as well, the first chamber 10 is preferably maintained at a higher pressure than that of the second chamber 60, and the pressures in the first, upper, and lower chambers 10, 62, and 64 are preferably set to be decreased in this order. The pressure in the lower chamber 64 is preferably 100 mTorr or less in the same manner as in the second chamber 12 of the first embodiment, and is more preferably 10 mTorr or less.

A second RF power supply 40 is connected to the support table 20 through a capacitor 42, in the same manner as in the first embodiment, and the conductive lower chamber 64 is grounded.

In the second embodiment as well, the operations of the respective RF power supplies, the valves, and the vacuum pump are controlled by a controller 50.

The Ar gas is converted to a plasma in the first chamber 10, and electrons of the plasma are supplied to the second chamber 60 to excite the reactive gas, thereby generating radicals. The second embodiment is the same as the first embodiment in this respect as well. In the second embodiment, as described above, the helical resonance type plasma generating section 70 is provided around the upper chamber 62 of the second chamber 60 and used as the auxiliary exciting means of the reactive gas. The helical resonance type plasma generating section 70 can cause discharge in a wide pressure range of $10^{-4}$ to $10^{-2}$ Torr. Note that the helical resonance type plasma generating section 70 as the auxiliary exciting means is used only for promoting generation of the radicals. The etching mechanism using the radicals is the same as that of the first embodiment.

Figure 6:
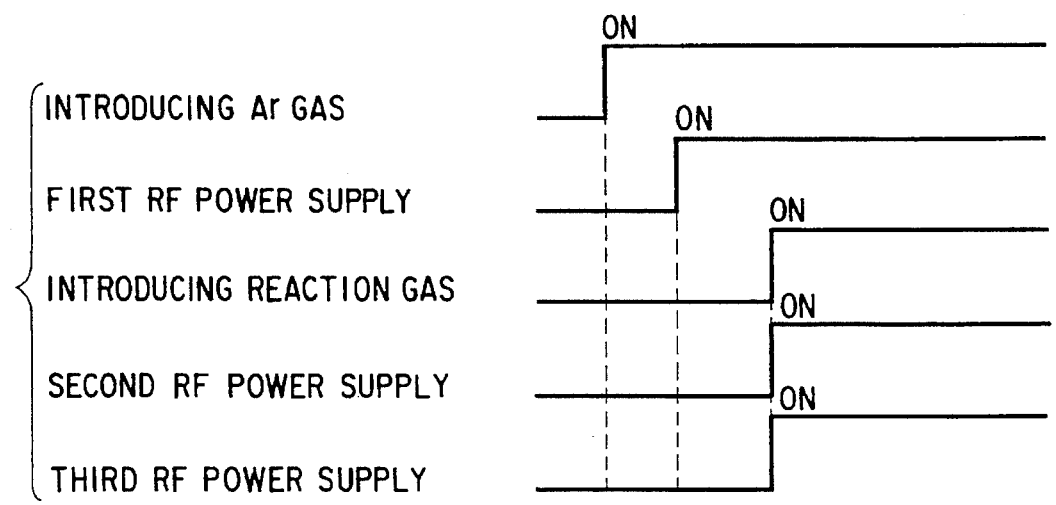
FIG. 6 is a timings chart showing gas introduction timings and the ON timing of power supplies when etching is performed using the apparatus of FIG. 5.

The etching operation is also basically the same as that of the first embodiment. The interiors of the first and second chambers 10 and 60 are evacuated by the vacuum pump 19 through the exhaust pipes 68. A valve 14a is opened to introduce the Ar gas from an inert gas source 15 into the first chamber 10 through a gas inlet pipe 14, and subsequently a first RF power supply 36 is turned on. Thereafter, the $CHF_3$ gas as the reactive gas is introduced from the reactive gas source 17 into the upper chamber 62 of the second chamber 60 through the gas inlet pipes 66, and simultaneously the second and third RF power supplies 40 and 74 are turned on. The gas introduction timings and the power supply turn-on timings of this case are shown in FIG. 6.

According to this embodiment, since a large amount of radicals are generated by the cooperation of the electrons of the plasma generated in the first chamber 10 and the helical resonance type plasma generating section 70, the etching rate of an oxide film 26 can be further increased.

The present invention is not limited to the above embodiments. For example, the means for converting the inert gas to a plasma in the first chamber 10 is not limited to the helicon wave type plasma generating section 30 described above, and can be other means, e.g., a helical resonance type plasma generating section. Alternatively, an ECR scheme for introducing a microwave into an ion generating section through a waveguide, and causing electrons to perform helical motion by means of an interaction with the magnetic field, thereby generating a high-density plasma in the conditions of electron cyclotron resonance, or an electron beam excitation scheme plasma generating section for converting the inert gas to a plasma by using an electron beam obtained by deriving electrons from the plasma and accelerating the electrons, may be employed.

The auxiliary exciting means is not limited to a helical resonance type plasma generating section but can be any means as far as it can excite the reactive gas.

The reactive gas used in the present invention is not limited to the various types of etching gases described above, and various other types of etching gases that can provide a high selectivity with respect to an underlying layer and a predetermined etching rate can be used.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A method of etching an insulating film of an object to be processed having the insulating film, comprising the steps of:

converting an inert gas to a plasma in a plasma generating region separate from the object to be processed;

generating radicals by exciting a reactive gas by the plasma of the inert gas in a region separate from said plasma generating region, and attracting ions in the plasma of the inert gas to the object to be processed and causing a reaction between the insulating film and the radicals by the assist of the ions;

wherein a pressure in said plasma generating region is set higher than that in said region separate from said plasma generating region while etching.

2. A method according to claim 1, wherein the step of generating the active species is executed after the step of converting the inert gas to a plasma is executed.

3. A method according to claim 1, wherein the inert gas contains at least one element selected from the group consisting of At, Kr, and Xe.

4. A method according to claim 1, wherein the reactive gas contains a halogen element.

5. An etching method according to claim 1, wherein a pressure in said second chamber is set at 100 mTorr or less while etching.

6. An etching method according to claim 5, wherein a pressure in said second chamber is set at 10 mTorr or less while etching.

7. An etching method for etching an insulation film formed on an object to be processed by means of an etching apparatus comprising:

a first chamber into which an inert gas is introduced;

means for making said inert gas into a plasma in said first chamber;

a second chamber, communicating with said first chamber, into which a reactive gas for etching said insulating film is introduced;

supporting means for supporting the object in said second chamber; and attracting means for attracting ions in the plasma of the inert gas to said object supported by said supporting means;

said method comprising the steps of:

introducing said inert gas into said first chamber;

making said inert gas into the plasma in said first chamber;

introducing said reactive gas into said second chamber;

generating radicals by exciting reactive gas in said second chamber by the plasma of the inert gas diffused to said second chamber; and attracting ions in the plasma in said inert gas to said object and making the insulating film and the radicals react with each other by the assist of the ions of the inert gas;

wherein a pressure on said first chamber is set higher than that in said second chamber while etching.

8. An etching method according to claim 7, wherein said inert gas contains one selected from the group consisting of Ar, Ar, Kr and Xe.

9. An etching method according to claim 7, wherein said reactive gas contains a halogen element.

10. An etching method according to claim 7, wherein a pressure in said second chamber is set at 100 mTorr or less while etching.

11. An etching method according to claim 10, wherein a pressure in said second chamber is set at 10 mTorr or less while etching.

12. An etching apparatus for etching an insulating film formed on an object to be processed, comprising:

a first chamber;

means for supplying an inert gas into said first chamber;

means for converting the inert gas into a plasma in the first chamber;

a second chamber communicating with said first chamber;

means for supplying a reactive gas for etching said insulating film, into said second chamber;

supporting means for supporting the object in said second chamber;

attracting means for attracting ions in the plasma of the inert gas to said objects supported by said supporting means; and control means for controlling pressure in said first and second chambers such that a pressure in said first chamber is set higher than that in said second chamber while etching:

wherein radicals are generated when the reactive gas introduced into said second chamber is excited by the plasma of the inert gas diffused from said first chamber to said second chamber, and the insulating film and the radicals react with each other by the assist of the ions of the inert gas, thereby etching the insulating film.

13. An apparatus according to claim 12, wherein said means for converting the inert gas to the plasma has a helicon wave type plasma generating section.

14. An apparatus according to claim 13, wherein said helicon wave type plasma generating section has a loop antenna provided around said first chamber, a magnetic field generator, arranged around said loop antenna, for generating a magnetic field in said first chamber, and an RF power supply connected to two ends of said loop antenna.

15. An etching apparatus according to claim 12, wherein said means for supplying said inert gas supplies a gas containing at least one selected from the group consisting of Ar, Kr, and Xe, into said first chamber.

16. An etching apparatus according to claim 12, wherein said means for supplying said reactive gas supplies a gas containing a halogen, into said second chamber.

17. An apparatus according to claim 12, wherein said attracting means has an electrode for placing the object to be processed thereon, and a power supply for applying a DC bias to said electrode, so that ions in the plasma of the inert gas are attracted to the object to be processed by the DC bias.

18. An apparatus according to claim 12, further comprising auxiliary exciting means for auxiliarily exciting the reactive gas in said second chamber.

19. An apparatus according to claim 18, wherein said auxiliary exciting means has a helical resonance type plasma generating section.

20. An apparatus according to claim 19, wherein said second chamber has upper and lower chambers communicating with each other, the reactive gas is introduced into said upper chamber, said helical resonance type plasma generating section has a coil helically wound on said upper chamber and an RF power supply for introducing an RF power to said coil, and the object to be processed is supported in said lower chamber.

21. An etching apparatus according to claim 20, further comprising:

exhaustion means for exhausting the first chamber and the second chamber; and wherein said control means controls said inert gas supply means, said reactive gas supply means and said exhaustion means so as to keep a pressure in said second chamber at 100 mTorr or less.

22. An etching apparatus according to claim 21, wherein said control means controls said inert gas supply means, said reactive gas supply means and said exhaustion means so as to keep a pressure in said second chamber at 10 mTorr or less.

23. An etching apparatus according to claim 20, further comprising:

exhaustion means for exhausting the first chamber and the second chamber; and wherein said control means controls said inert gas supply means, said reactive gas supply means and said exhaustion means so as to make a pressure in said first chamber higher than that in said second chamber.

24. An etching apparatus according to claim 12, further comprising:

exhaustion means for exhausting the first chamber and the second chamber; and wherein said control means controls said inert gas supply means, said reactive gas supply means and said exhaustion means so as to keep a pressure in said second chamber at 100 mTorr or less.

25. An etching apparatus according to claim 24, wherein said control means controls said inert gas supply means, said reactive gas supply means and said exhaustion means so as to keep a pressure in said second chamber at 10 mTorr or less.

26. An etching apparatus according to claim 12, further comprising:

exhaustion means for exhausting the first chamber and the second chamber; and wherein said control means controls said inert gas supply means, said reactive gas supply means and said exhaustion means so as to make a pressure in said first chamber higher than that in said second chamber.

27. An apparatus for etching an insulating film of an object to be process having the insulating film, comprising:

means for converting an inert gas to a plasma in a first chamber separate from the object to be processed;

means for generating radicals by exciting a reactive gas by the plasma of the inert gas in a second chamber separate from said first chamber, said second chamber including auxiliary exciting means for exciting the reactive gas in said second chamber; and a third chamber communicating with said second chamber, said third chamber including electrode means for attracting ions in the plasma of the inert gas to the object to be processed and causing a reaction between the insulating film and the active species by the assist of the ions.

28. An apparatus according to claim 27, wherein said means for converting the inert gas to the plasma has a helicon wave type plasma generating section.

29. An apparatus according claim 27, wherein the reactive gas is introduced into the second chamber and the plasma of the inert gas is diffused in said second chamber.

30. An apparatus according to claim 27, wherein said electrode means has an electrode for placing the object to be processed thereon, and a power supply for applying a DC bias to said electrode, so that the ions in the plasma of the inert gas are attracted to the object to be processed by the DC bias.

31. An etching apparatus according to claim 27, further comprising:

exhaustion means for exhausting the first chamber and the second chamber; and control means for controlling said inert gas supply means, said reactive gas supply means and said exhaustion means so as to keep a pressure in said second chamber at 100 mTorr or less.

32. An etching apparatus according to claim 27, further comprising:

exhaustion means for exhausting the first chamber and the second chamber; and control means for controlling said inert gas supply means, said reactive gas supply means and said exhaustion means so as to make a pressure in said first chamber higher than that in said second chamber.

* * * * *